United States Patent
Kwon (10) Patent No.: US 10,020,052 B2
(45) Date of Patent: Jul. 10, 2018

(54) RESISTIVE MEMORY DEVICE AND MEMORY SYSTEM INCLUDING THE SAME

(71) Applicant: SK hynix Inc., Gyeonggi-do (KR)

(72) Inventor: Jung-Hyun Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/617,090

(22) Filed: Jun. 8, 2017

(65) Prior Publication Data

US 2018/0108408 A1  Apr. 19, 2018

(30) Foreign Application Priority Data

Oct. 19, 2016 (KR) ........................ 10-2016-0135657

(51) Int. Cl.
*G11C 13/00* (2006.01)

(52) U.S. Cl.
CPC ........ *G11C 13/0059* (2013.01); *G11C 13/004* (2013.01); *G11C 13/0038* (2013.01)

(58) Field of Classification Search
CPC .................... G11C 13/0069; G11C 13/0004

USPC .......................................................... 365/148
See application file for complete search history.

(56) References Cited

U.S. PATENT DOCUMENTS

| | | | |
|---|---|---|---|
| 6,914,801 B2 | 7/2005 | Kostylev et al. | |
| 7,965,545 B2 | 6/2011 | Savransky et al. | |
| 9,558,823 B1* | 1/2017 | Khwa | G11C 13/0069 |
| 2017/0141161 A1* | 5/2017 | Sakotsubo | H01L 27/2481 |

* cited by examiner

*Primary Examiner* — Huan Hoang
*Assistant Examiner* — Minh Dinh
(74) *Attorney, Agent, or Firm* — IP & T Group LLP (57) ABSTRACT

A resistive memory device includes a first region including a first region including a plurality of first resistive memory cells, and a second region including a plurality of second resistive memory cells, wherein the resistive memory device is suitable for applying a first recovery pulse cyclically at a regular interval to the first resistive memory cells for recovering a drift of the first memory cells, and for applying a second recovery pulse to a read target memory cell among the second memory resistive cells.

19 Claims, 4 Drawing Sheets

RESISTIVE MEMORY DEVICE AND MEMORY SYSTEM INCLUDING THE SAME

CROSS-REFERENCE TO RELATED APPLICATION

This application claims priority under 35 U.S.C. § 119 to Korean Patent Application No. 10-2016-0135657 filed on Oct. 19, 2016 In the Korean Intellectual Property Office, the disclosure of which is incorporated herein by reference in its entirety.

TECHNICAL FIELD

Exemplary embodiments relate to a resistive memory device and a memory controller which controls a memory device.

DISCUSSION OF THE RELATED ART

Recently, research for next generation memory devices for replacing a dynamic random access memory (DRAM) and a flash memory has been actively conducted. One of such next generation memory devices is a resistive memory device which uses a material capable of being abruptly changed in its resistance by a bias applied thereto and thereby switching between at least two different resistance states, that is, a variable resistance material. Representative examples of the resistive memory device may include a phase-change random access memory (PCRAM), a resistive random access memory (RRAM), a magnetic random access memory (MRAM) and a ferroelectric random access memory (FRAM).

In particular, in a resistive memory device, a memory cell array is configured to have a cross point array structure. The cross point array structure means a structure where a plurality of bottom electrodes (for example, a plurality of row lines (or word lines)) and a plurality of top electrodes (for example, a plurality of column lines (or bit lines)) are formed to intersect with each other and memory cells, in each of which a variable resistance element and a selection element are coupled in series, are disposed at the intersections of the bottom electrodes and the top electrodes.

Although a resistive memory device is developed as a nonvolatile memory device, a drift phenomenon occurs, in which a resistance value varies as time passes after data is written in a memory cell and as a result the data is likely to be lost.

SUMMARY

Various embodiments are directed to a technology for recovering effectively the drift phenomenon of a resistive memory device.

In an embodiment, a resistive memory device may include: a first region including a plurality of first resistive memory cells, and a second region including a plurality of second resistive memory cells, wherein the resistive memory device is suitable for applying a first recovery pulse cyclically at a regular interval to the first resistive memory cells for recovering a drift of the first memory cells, and for applying a second recovery pulse to a read target memory cell among the second memory resistive cells.

In the read operation for the second region the second recovery pulse may be applied to the read target resistive memory cell, and, after application of the second recovery pulse, a read voltage may be applied to and data is read from the read target resistive memory cell.

The resistive memory device may further include a third region including a plurality of third resistive memory cells, and wherein no recovery pulse is applied to the plurality of third resistive memory cells in a sleep mode.

The sleep mode is ended in the case where a read operation for the third region is requested.

After the sleep mode is ended, a third recovery pulse may be applied at least once to the plurality of third resistive memory cells, and, then, the read operation for the third region may be started.

The read operation for the third region may be performed in the same manner as a read operation for the first region.

After the sleep mode is ended, the read operation for the plurality of third resistive memory cells may be performed in the same manner as the read operation for the second region.

The resistive memory device may further include a fourth region including a plurality of fourth resistive memory cells, wherein a level of a read voltage to be applied to a target fourth resistive memory cell among the plurality of fourth resistive memory cells is adjusted in a read operation for the fourth region.

The level of the read voltage to be applied to the target fourth resistive memory cell may be adjusted according to a time passed after data is written in the fourth region.

Each of the plurality of first resistive memory cells and the plurality of second resistive memory cells may include a resistive memory element; and a selection element.

The resistive memory device may further include a recovery pulse application circuit suitable for applying the first, second and third recovery pulses to the memory cells of the respective first, second and third regions; and a read voltage adjustment circuit suitable for applying the adjusted read voltage to the memory cells of the fourth region.

In an embodiment, a memory system may include: a resistive memory device including a first region including a plurality of first resistive memory cells and a second region including a plurality of second resistive memory cells; and a memory controller suitable for applying cyclically a recovery command and an address designating some of the plurality of first resistive memory cells, to the resistive memory device, and applying, in a read operation for the second region, a read with recovery command and an address designating some of the plurality of second resistive memory cells, to the resistive memory device.

The memory controller may apply, in a read operation for the first region, a read command and an address designating some of the plurality of first resistive memory cells, to the resistive memory device.

When the read with recovery command is applied, recovery pulse may be applied to target second resistive memory cells selected among the plurality of second resistive memory cells, and, after application of the recovery pulse, a read voltage may be applied to and data may be read from the target second resistive memory cells.

The resistive memory device may further includes a third region including a plurality of third resistive memory cells, suitable for receiving no recovery pulse to the plurality of third resistive memory cells in a sleep mode.

The sleep mode may be ended in the case where a read operation for the third region is requested.

After the sleep mode is ended, the memory controller may apply a multitude of times a recovery command for the third region and an address to the resistive memory device such that recovery pulse is applied at least once to the plurality of third resistive memory cells, and may then apply a read command for the third region and an address.

After the sleep mode is ended, the memory controller may apply, in a read operation for the third region, a read with recovery command for the third region and an address.

The resistive memory device may further include a fourth region including a plurality of fourth resistive memory cells, and the memory controller may adjust a level of a read voltage to be applied to a target fourth resistive memory cell among the plurality of fourth resistive memory cells in a read operation for the fourth region.

The level of the read voltage to be applied to the target fourth resistive memory cell may be adjusted according to a time passed after data is written in the fourth region.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
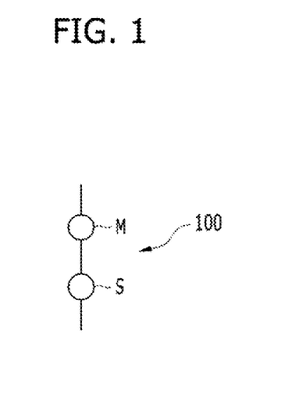
FIG. 1 is a diagram illustrating a resistive memory cell of a resistive memory device.
Figure 2:
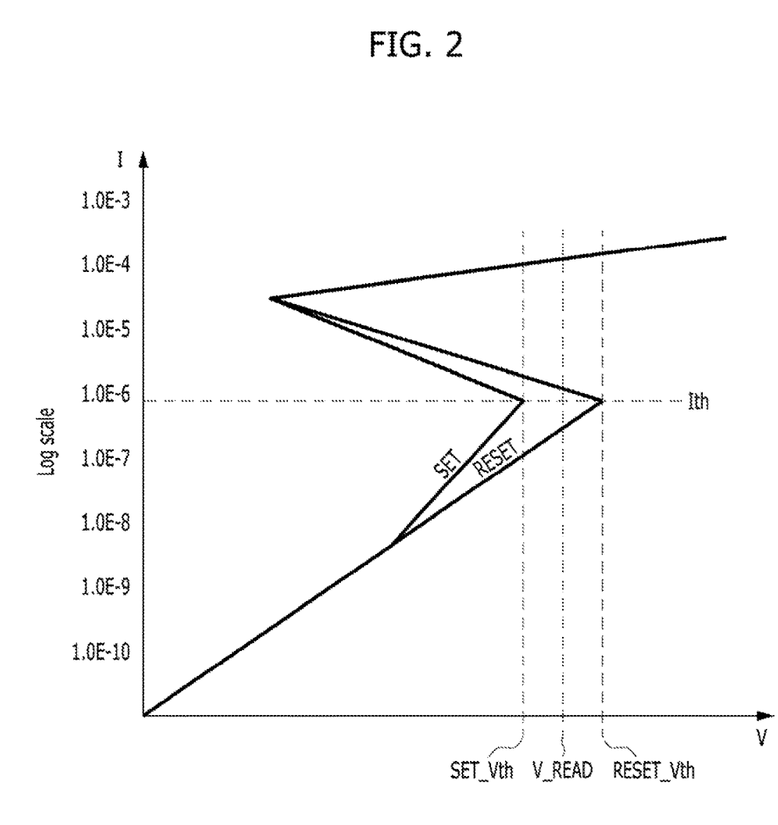
FIG. 2 is a diagram illustrating the I-V curve of the resistive memory cell of FIG. 1.

FIG. 1 is a diagram illustrating a resistive memory cell 100 of a resistive memory device, and FIG. 2 is a diagram illustrating the current-voltage (I-V) curve of the resistive memory cell 100.

Referring to FIG. 1, the resistive memory cell 100 may include a resistive memory element M and a selection element S.

The resistive memory element M may be in a low resistance state (also referred to as a set state) or a high resistance state (also referred to as a reset state) depending on the data stored therein. The resistive memory element M may be a phase-change memory element, and may have a low resistance value when it is in a crystalline state and a high resistance value when it is in an amorphous state.

The selection element S may allow flow of only a substantially small amount of current when it is turned off. The selection element S may be turned on when an amount of current flowing through the resistive memory cell 100 exceeds a threshold current (Ith), thereby allowing flow of a substantially larger amount of current than before. After the selection element S is turned on, a snapback phenomenon may occur meaning that a voltage level at both ends of the resistive memory cell 100 abruptly may decrease. The selection element S may be an Ovonic threshold switch (OTS) element.

FIG. 2 is a diagram illustrating current flowing through the resistive memory cell 100 according to the voltage applied to both ends of the resistive memory cell 100. Regardless of a resistive memory cell which is in a high resistance state RESET or a resistive memory cell which is in a low resistance state SET, an amount of current flowing through a resistive memory cell increases as the level of the voltage applied to both ends of the resistive memory cell is increased. At the same voltage level, a larger amount of current may flow through a resistive memory cell which is in the low resistance state SET than a resistive memory cell which is in the high resistance state RESET.

When a voltage at both ends of a resistive memory cell which is in the low resistance state SET reaches a threshold voltage SET_Vth of the low resistance state SET, that is, when an amount of current flowing through the resistive memory cell which is in the low resistance state SET reaches a threshold current Ith, the selection element S of the resistive memory cell which is in the low resistance state SET is turned on, resulting in a snapback phenomenon abruptly decreasing a voltage level at both ends of the resistive memory cell and abruptly increasing a current flowing through the resistive memory cell.

When a voltage at both ends of a resistive memory cell which is in the high resistance state RESET reaches a threshold voltage RESET_Vth of the high resistance state RESET, that is, when an amount of current flowing through the resistive memory cell which is in the high resistance state RESET reaches the threshold current Ith, the selection element S of the resistive memory cell 100 which is in the high resistance state RESET is turned on, resulting in a snapback phenomenon abruptly decreasing a voltage level at both ends of the resistive memory cell 100 and abruptly increasing a current flowing through the resistive memory cell 100.

Reading of the data stored in the resistive memory cell 100 may be performed using the snapback phenomenon. By applying a read voltage V_READ larger than the threshold voltage SET_Vth of the low resistance state SET and smaller than the threshold voltage RESET_Vth of the high resistance state RESET to both ends of the resistive memory cell 100, if the resistive memory cell 100 is in the low resistance state SET, a large amount of current may flow through the resistive memory cell 100 as the snapback phenomenon occurs in the resistive memory cell 100, and, if the resistive memory cell 100 is in the high resistance state RESET, a small amount of current may flow through the resistive memory cell 100 as the snapback phenomenon does not occur in the resistive memory cell 100. Therefore, by applying the read voltage V_READ to both ends of the resistive memory cell 100 and sensing an amount of current flowing through the resistive memory cell 100, it may be determined whether the resistive memory cell 100 is in the low resistance state SET or the high resistance state RESET.

Writing (or programming) of data in the resistive memory cell 100 may be performed by applying write current to the resistive memory cell 100 and thereby converting the resistive memory element M of the resistive memory cell 100 into a melted state. After converting the resistive memory element M into the melted state, by gradually decreasing the write current, the resistive memory element M may be changed to a crystalline state and become the low resistance state SET. After converting the resistive memory element M into the melted state, by quickly decreasing the write current, the resistive memory element M may be changed to an amorphous state and become the high resistance state RESET.

The resistance value of the resistive memory element M of the resistive memory cell 100 may vary due to a phenomenon called a drift as time passes. Also, it is known that the resistance value of the selection element S may vary due to the drift phenomenon as time passes. That is to say, the data stored in the resistive memory cell 100 may be lost because of the drift phenomenon. The drift of the resistive memory cell 100 may be recovered by allowing an amount of current equal to or larger than the threshold current Ith to flow through the resistive memory cell 100. In other words, the drift of the resistive memory cell 100 may be recovered by applying a recovery pulse having a voltage level equal to or higher than the threshold voltage RESET_Vth of the high resistance state RESET to both ends of the resistive memory cell 100 and thereby allowing an amount of current equal to or larger than the threshold current Ith to flow through the resistive memory cell 100.

Figure 3A:
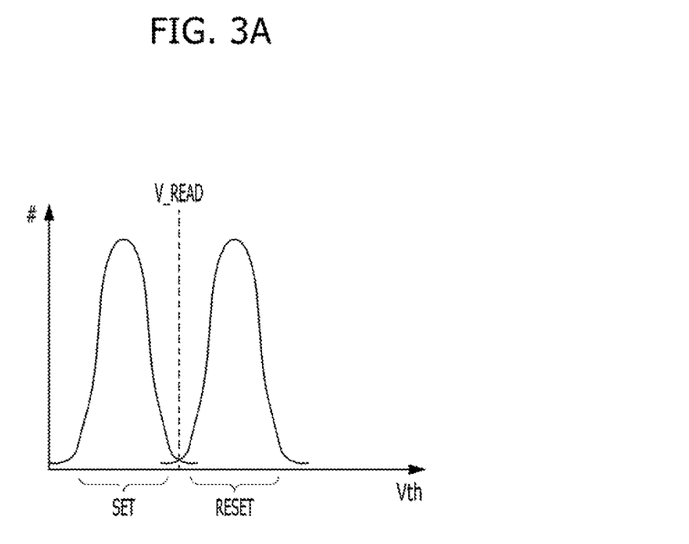
FIGS. 3A to 3C are diagrams illustrating the threshold voltage distributions of memory cells in a resistive memory device.
Figure 3B:
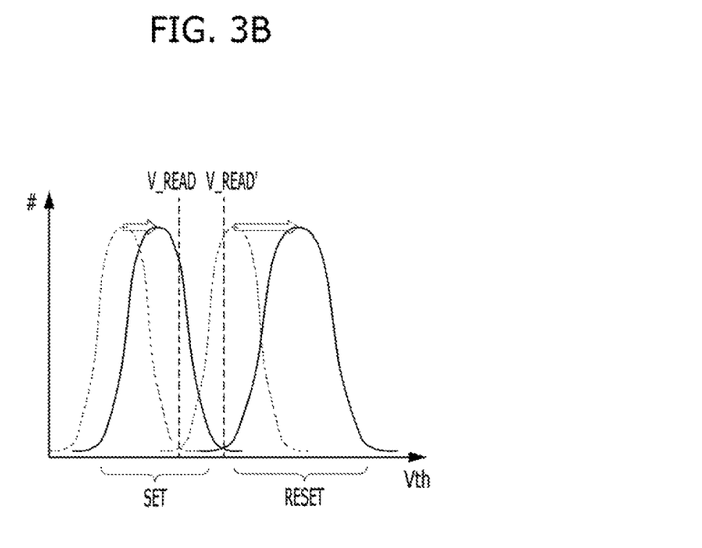
Figure 3C:
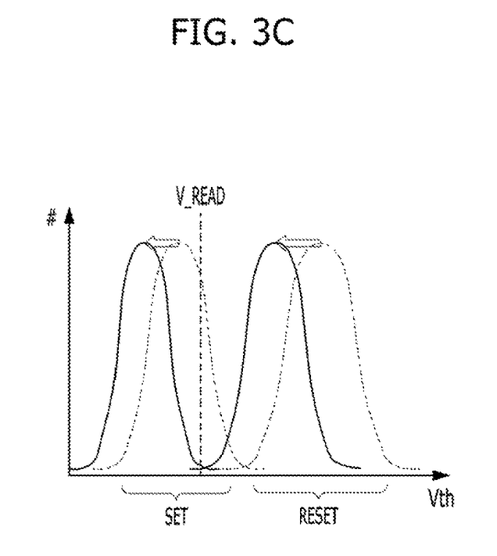

FIGS. 3A to 3C are diagrams illustrating threshold voltage distributions of memory cells in a resistive memory device.

FIG. 3A illustrates the threshold voltage distributions of memory cells immediately after data are written. The X axis represents threshold voltage Vth, and the Y axis represents the number of memory cells #. In the case where the threshold voltage distributions of memory cells are as shown in FIG. 3A, memory cells of a set state SET and memory cells of a reset state RESET may be distinguished by using a read voltage V_READ.

FIG. 3B illustrates the threshold voltage distributions as a result of drift occurring in the memory cells as time passes from the state illustrated in FIG. 3A. Referring to FIG. 3B, it may be seen that both the threshold voltages of the memory cells of the set state SET and the threshold voltages of the memory cells of the reset state RESET have increased. Thus, when the drift phenomenon occurs, the memory cells of the set state SET and the memory cells of the reset state RESET should be distinguished by using a higher read voltage V_READ'. Since a drift value is not constant although the drift value has a tendency to increase with the passage of time, it is substantially difficult to appropriately determine what the value of the read voltage V_READ' should be at any given time after the initial programming in order to account for the shift in the threshold distributions due to the drift phenomenon. As a result, when substantial drift has occurred the data stored in the memory cells could lost.

FIG. 3C illustrates that the drift phenomenon is recovered because of a recovery pulse applied to the memory cells. As shown in FIG. 3C, by applying the recovery pulse to both ends of the memory cells in which the drift phenomenon occurred as in FIG. 3B, the drift may be recovered and the threshold voltages of the memory cells may be returned to their initial state.

Figure 4:
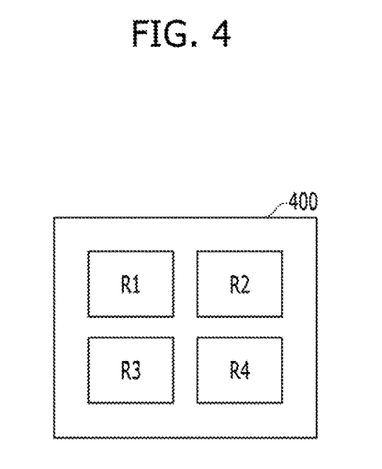
FIG. 4 is a diagram illustrating a cell array of a resistive memory device in accordance with an embodiment of the present invention.

FIG. 4 is a diagram illustrating a cell array 400 of a resistive memory device in accordance with an embodiment of the present invention.

Referring to FIG. 4, the cell array 400 may include first to fourth regions R1 to R4, each of the first to fourth regions R1 to R4 including a plurality of resistive memory cells. Different drift recovery policies may be employed for the respective first to fourth regions R1 to R4. In the cell array 400, the first to fourth regions R1 to R4 may be defined based on the drift recovery policy applied to each region, meaning that the first region may be subject to a first drift recovery policy, the second region may be subject to a second drift recovery region, the third region may be subject a third drift recovery region and the fourth region may be subject to a fourth drift recovery region. The first to fourth drift recovery policies may not be fixed. Also, the drift recovery policies may be switched between the various regions. For example, a region which is categorized initially as the fourth region R4 because the drift fourth recovery policy applies to that region in the cell array 400 may be changed to the first region R1 meaning that it may become subject to the first drift recovery policy. Further, it is noted that while FIG. 4, illustrates the cell array 400 being divided into four regions based on the drift recovery policy which is applied to each region, the present invention is not limited in this way. Generally, the number of regions may vary based on design. For example, in an embodiment, only the first region R1 and the second region R2 may exist in the cell array 400 and the third region R3 and the fourth region R4 may not exist in the cell array 400.

Referring, to the FIG. 4, in an embodiment, the array 400 is categorized in four regions, the resistive memory cells of the first region R1 may be recovered cyclically. A recovery pulse may be applied sequentially to the resistive memory cells in the first region R1 with a predetermined time interval. As if the memory cells of a DRAM are refreshed cyclically, a recovery pulse may be applied cyclically to the resistive memory cells in the first region R1. Since the resistive memory cells are recovered cyclically in the first region R1, it is not necessary to worry about a drift phenomenon for the resistive memory cells. Therefore, an immediate read operation may be possible without consideration for a drift. However, current consumption may be increased by the cyclical recovery operation. Due to such a characteristic, data of which read latency is regarded important, that is, data of which performance is regarded important, may be recorded in the first region R1. A cycle with which the resistive memory cells are recovered may be determined according to the data retention time of the resistive memory device. For example, the resistive memory cells may be recovered every several minutes in the case where the data retention time of the resistive memory device is short, or may be recovered every several hours, every several days or every several months in the case where the data retention time of the resistive memory device is long.

A recovery operation for the resistive memory cells of the second region R2 may be performed together with a read operation. A recovery pulse may be applied to read target resistive memory cells in each read operation, and data may be read as a read voltage is applied after the read target resistive memory cells are recovered. In the second region R2, because recovery pulse is applied to read target resistive memory cells in each read operation and data should be read as a read voltage is applied from then, a longer time may be required for the read operation. In other words, a read latency may be lengthened. However, since the recovery operation is performed only in the case where the read operation is needed, an unnecessary recovery operation may not be performed and thus current consumption may be reduced. Due to such a characteristic, data of which read latency is regarded unimportant may be recorded in the second region R2.

The third region R3 may be a sleep region. A region which does not need a read operation for a while is distinguished as the third region R3, and may be converted to a sleep mode. In the sleep mode, a recovery operation for resistive memory cells in the third region R3 may not be performed. When a read operation for the third region R3 is requested, the sleep mode may be ended. When it is not necessary to end the sleep mode in a hurried manner, a scheme of ending the sleep mode may include performing a read operation after first performing once a recovery operation for the entire resistive memory cells of the third region R3, and, thereafter, performing the read operation i.e., the read operation is performed in the same manner as in the first region R1. When it is necessary to end the sleep mode in a hurried manner, that is, when it is necessary to perform a read operation immediately, a scheme of ending the sleep mode may include, changing the drift recovery policy of the third region R3 to become the same as the second region R2, and performing a read operation immediately together with a recovery operation for the target memory cells.

The fourth region R4 may be a region where a recovery operation is not performed and a drift phenomenon is resolved by changing the level of the read voltage V_READ. A recovery pulse is not applied to the resistive memory cells of the fourth region R4. Instead, the read voltage V_READ used in a read operation for resistive memory cells may be adjusted in correspondence to the drift phenomenon. Since the drift phenomenon increases with the passage of time after data are written, the read voltage V_READ may be adjusted to have a higher value as time passes after data are written in the fourth region R4. In the case where the read operation scheme as in the fourth region R4 is used, because the level of the read voltage V_READ should be adjusted before the read operation, a substantial time is required for the process of preparing the read operation. Due to the characteristics of the fourth region R4, data such as streaming data, or a large amount of data which are to be read successively but for which the read operation is not performed frequently, may be recorded in the fourth region R4.

Figure 5:
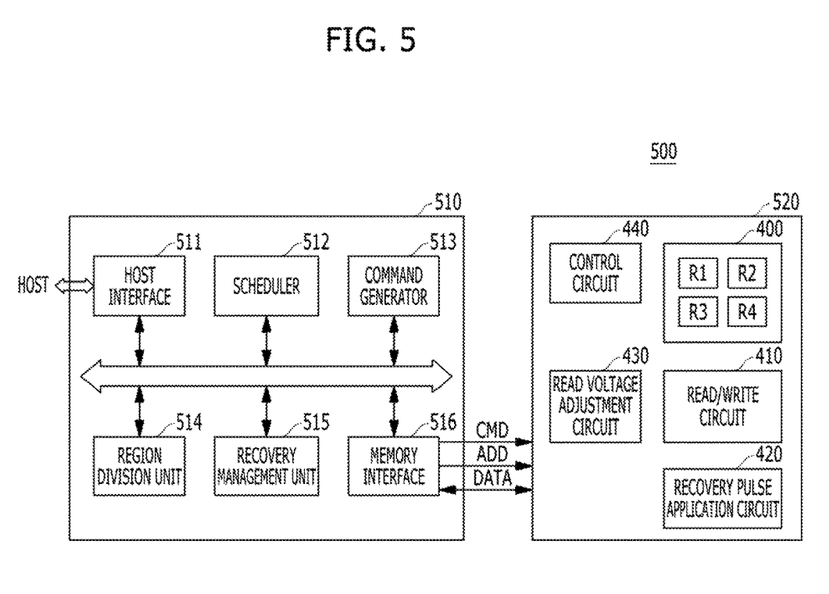
FIG. 5 is a diagram illustrating a memory system in accordance with an embodiment of the present invention.

FIG. 5 is a diagram illustrating a memory system 500, in accordance with an embodiment of the present invention.

Referring to FIG. 5, the memory system 500 may include a memory controller 510 and a resistive memory device 520.

The memory controller 510 may control an operation of the resistive memory device 520 according to a request received from a host HOST. The host HOST may include a central processing unit (CPU), a graphic processing unit (GPU), an application processor (AP), or the like. The memory controller 510 may include a host interface 511, a scheduler 512, a command generator 513, a region division unit 514, a recovery management unit 515, and a memory interface 516.

The host interface 511 may be provided for interfacing the memory controller 510 and the host HOST. Through the host interface 511, requests received from the host HOST may be received and processing results of the requests may be transmitted to the host HOST.

The scheduler 512 may determine a sequence of the requests to be instructed to the resistive memory device 520, among the requests received from the host HOST. The scheduler 512 may differentiate a sequence in which requests are received from the host HOST to generate a sequence of operations to be instructed to the memory device 520 for improving the performance of the resistive memory device 520. For example, even though the host HOST may request first a read operation of the resistive memory device 520 and then requests a write operation of the resistive memory device 520, a sequence may be adjusted such that the write operation is performed earlier than the read operation.

The command generator 513 may generate commands to be applied to the resistive memory device 520, in conformity with the sequence of operations determined by the scheduler 512.

The region division unit 514 may determine whether or not the cell array 400 should be divided in regions and to how many regions. For example, the region division unit 514 may divide the cell array 400 of the resistive memory device 520 into a plurality of regions, for example, the first to fourth regions R1 to R4 of FIG. 4. The region division by the region division unit 514 may be performed according to an instruction from the host HOST. For example, the host HOST may instruct the region division unit 514 to adjust the sizes of respective regions according to the amount and kind of data to be stored in the resistive memory device 520. The cell array 400 may not necessarily be divided. For example, in the case where the host HOST wants to store only data of which read latency is regarded important, in the resistive memory device 520, the host HOST may instruct the region division unit 514 to designate the entire cell array 400 as one region. Also, the cell array 400 may not be divided only on four regions but may be divided in two, three four or more regions as may be needed.

The recovery management unit 515 may manage the recovery operations for the regions (e.g., first to fourth regions R1 to R4) of the cell array 400 divided by the region division unit 514. In an embodiment, the recovery operations for the first to fourth regions R1 to R4 of FIG. 4 may be performed according to the aforementioned drift recovery policies by the first to fourth regions R1 to R4.

The memory interface 516 may be provided for interfacing the memory controller 510 and the resistive memory device 520. Through the memory interface 516, a command CMD and an address ADD may be transferred from the memory controller 510 to the resistive memory device 520. Also data DATA may be transmitted and received between the resistive memory device 520 and the memory controller 510. The memory interface 516 may also be referred to as a PHY interface.

The resistive memory device 520 may perform read, write and recovery operations according to control of the memory controller 510. The resistive memory device 520 may include the cell array 400, a read/write circuit 410, a recovery pulse application circuit 420, a read voltage adjustment circuit 430, and a control circuit 440.

The cell array 400 may include a plurality of resistive memory cells which are respectively disposed at areas where a plurality of row lines (also referred to as word lines) and a plurality of column lines (also referred to as bit lines) intersect with each other. The cell array 400 may further include a row decoder and a column decoder for selecting a resistive memory cell to be accessed among the resistive memory cells. A resistive memory cell to be accessed among the resistive memory cells of the cell array 400 may be selected by the address ADD. As described above, in an embodiment, the cell array 400 may be divided into the first to fourth regions R1 to R4.

The read/write circuit 410 may read the data of a resistive memory cell selected among the resistive memory cells of the cell array 400 or write data in a resistive memory cell selected among the resistive memory cells of the cell array 400. Reading of data may be performed by applying a read voltage to both ends of a selected resistive memory cell and then sensing an amount of current flowing through the selected resistive memory cell. Writing of data may be performed by converting the resistive memory element of a selected memory cell into a melted state through applying write current to the selected memory cell and by then gradually decreasing the write current (to correspond to a low resistance state) or quickly decreasing the write current (to correspond to a high resistance state). The read/write circuit 410 may transfer data to be written, from the memory controller 510 in a write operation, and may transfer read data to the memory controller 510 in a read operation.

The recovery pulse application circuit 420 may apply a recovery pulse to both ends of a resistive memory cell selected among the resistive memory cells of the cell array 400.

The read voltage adjustment circuit 430 may adjust the level of the read voltage V_READ to be used in the read operation, according to control of the memory controller 510.

The control circuit 440 may control the cell array 400, the read/write circuit 410, the recovery pulse application circuit 420 and the read voltage adjustment circuit 430 such that the read operation, the write operation and the recovery operation instructed from the memory controller 510 are performed.

Hereinbelow, descriptions will be made for how a recovery operation and a read operation are performed by the first to fourth regions R1 to R4 in the memory system 500.

Recovery and Read Operations for the First Region R1

The memory controller 510 may apply the command CMD for recovering the resistive memory cells of the first region R1, that is, a recovery command, and the address ADD for designating a memory cell of the first region R1, cyclically to the resistive memory device 520. Then, the resistive memory device 520 may perform a recovery operation of applying recovery pulse to the resistive memory cell selected by the address ADD. A frequency with which the memory controller 510 applies the recovery command to the resistive memory device 520 may be determined according to the data retention time of the resistive memory device 520. For example, if the data retention time of the resistive memory device 520 is one hour, the memory controller 510 may apply the recovery command to the resistive memory device 520 at a frequency with which the recovery pulse may be applied at least once to all the resistive memory cells in the first region R1 for one hour. Each time the recovery command is applied, the value of the address ADD applied together with the recovery command may be changed.

A read operation for the first region R1 may be performed as the memory controller 510 applies the command CMD for a read operation, that is, a read command, and the address ADD for designating a memory cell of the first region R1, to the resistive memory device 520. Then, the read voltage V_READ is applied, in the resistive memory device 520, to the resistive memory cell of the first region R1 designated by the address ADD, and data may be read and be then transmitted to the memory controller 510.

Recovery and Read Operations for the Second Region R2

Recovery and read operations for the second region R2 may be performed simultaneously. In the case where a read operation for the resistive memory cells of the second region R2 is needed, the memory controller 510 may apply the command CMD to instruct a recovery operation and a read operation to be performed, that is, a read with recovery command, and the address ADD for designating a memory cell of the second region R2, to the resistive memory device 520. Then, in the resistive memory device 520, a recovery pulse may be applied to both ends of the resistive memory cell designated by the address ADD, and, after the application of the recovery pulse, the read voltage V_READ may be applied and data may be read. The read data may be transferred to the memory controller 510.

Recovery and Read Operations for the Third Region R3

Since it is not necessary to perform any operation for the third region R3 in the case where the third region R3 is in a sleep mode, the memory controller 510 may not apply any command associated with the third region R3, to the resistive memory device 520.

In the case where it is necessary to end the sleep mode of the third region R3 and perform a read operation for the third region R3, the memory controller 510 may apply a recovery command and the address ADD a multitude of times to the resistive memory device 520 such that all the resistive memory cells of the third region R3 may be recovered at least once. After the recovery pulse is applied at least once to all the resistive memory cells of the third region R3, and the memory controller 510 may perform a read operation and a recovery operation by controlling the third region R3 in the same manner as the first region R1.

In the case where it is necessary to end the sleep mode of the third region R3 and immediately perform a read operation, the memory controller 510 may control the third region R3 in the same manner as the second region R2. In this case, while the latency of an individual read operation is lengthened, it is possible to immediately perform a read operation.

Read Operation for the Fourth Region R4

As described above, a recovery operation for the fourth region R4 may not be performed. In the case where a read operation for the fourth region R4 is needed, the memory controller 510 may apply the command CMD for adjusting the level of the read voltage V_READ, that is, a read voltage adjustment command, and the address ADD, to the resistive memory device 520. Then, the read voltage adjustment circuit 430 of the resistive memory device 520 may adjust the level of the read voltage V_READ according to the value of the address ADD applied together with the read voltage adjustment command. Since the drift value of a resistive memory cell has a tendency to increase with the passage of time after a write operation is performed, the memory controller 510 may refer to a time passed after the write operation is performed for the fourth region R4, in determining the level of adjustment required in adjusting the level of the read voltage V_READ.

After the level of the read voltage V_READ is adjusted, the memory controller 510 may apply the command CMD for a read operation, that is, a read command, and the address ADD for designating a memory cell of the fourth region R4, to the resistive memory device 520. Then, a read operation may be performed in the fourth region R4 of the resistive memory device 520.

After the read operation for the fourth region R4 is performed, the memory controller 510 may apply a read voltage adjustment command and the address ADD to the resistive memory device 520, and thereby adjust the level of the read voltage V_READ to an original level. This may be to allow a read operation to be performed more precisely in the other regions R1 to R3.

According to the various embodiments of the present disclosure, the drift of a resistive memory device may be recovered effectively.

Although various embodiments have been described for illustrative purposes, it will be apparent to those skilled in the art that various changes and modifications may be made without departing from the spirit and scope of the invention as defined in the following claims.

What is claimed is:

1. A resistive memory device comprising:
    a first region including a plurality of first resistive memory cells, and
    a second region including a plurality of second resistive memory cells, wherein, in the first region, a first recovery pulse is applied sequentially to all of the first resistive memory cells with a regular interval, and, in the second region, at every read operation a second recovery pulse is applied to a read target resistive memory cell among the second resistive memory cells before applying a read voltage to the read target resistive memory cell.

2. The resistive memory device according to claim 1, wherein, in the read operation for the second region the second recovery pulse is applied to the read target resistive memory cell, and, after application of the second recovery pulse, the read voltage is applied to and data is read from the read target resistive memory cell.

3. The resistive memory device according to claim 1, further comprising:
a third region including a plurality of third resistive memory cells, and wherein no recovery pulse is applied to the plurality of third resistive memory cells in a sleep mode.

4. The resistive memory device according to claim 3, wherein the sleep mode is ended in the case where a read operation for the third region is requested.

5. The resistive memory device according to claim 4, wherein, after the sleep mode is ended, a third recovery pulse is applied at least once to the plurality of third resistive memory cells, and, then, the read operation for the third region is started.

6. The resistive memory device according to claim 5, wherein the read operation for the third region is performed in the same manner as a read operation for the first region.

7. The resistive memory device according to claim 4, wherein, after the sleep mode is ended, the read operation for the plurality of third resistive memory cells is performed in the same manner as the read operation for the second region.

8. The resistive memory device according to claim 1, further comprising:
a fourth region including a plurality of fourth resistive memory cells,
wherein a level of a read voltage to be applied to a target fourth resistive memory cell among the plurality of fourth resistive memory cells is adjusted in a read operation for the fourth region.

9. The resistive memory device according to claim 8, wherein the level of the read voltage to be applied to the target fourth resistive memory cell is adjusted according to a time passed after data is written in the fourth region.

10. The resistive memory device according to claim 1, wherein each of the plurality of first resistive memory cells and the plurality of second resistive memory cells comprises:
a resistive memory element; and
a selection element.

11. The resistive memory device according to claim 9, further comprising:
a recovery pulse application circuit suitable for applying the first, second and third recovery pulses to the memory cells of the respective first, second and third regions; and
a read voltage adjustment circuit suitable for applying the adjusted read voltage to the memory cells of the fourth region.

12. A memory system comprising:
a resistive memory device including a first region including a plurality of first resistive memory cells and a second region including a plurality of second resistive memory cells; and
a memory controller suitable for applying cyclically a recovery command and an address designating some of the plurality of first resistive memory cells, to the resistive memory device, so that a recovery pulse is applied sequentially to all of the first resistive memory cells with a regular interval, and applying, in a read operation for the second region, a read with recovery command and an address designating some of the plurality of second resistive memory cells, to the resistive memory device,
wherein, when the read with recovery command is applied, the recovery pulse is applied to target second resistive memory cells selected among the plurality of second resistive memory cells, and, after application of the recovery pulse, a read voltage is applied to and data is read from the target second resistive memory cells.

13. The memory system according to claim 12, wherein the memory controller applies, in a read operation for the first region, a read command and an address designating some of the plurality of first resistive memory cells, to the resistive memory device.

14. The memory system according to claim 12, wherein the resistive memory device further includes a third region including a plurality of third resistive memory cells, suitable for receiving no recovery pulse to the plurality of third resistive memory cells in a sleep mode.

15. The memory system according to claim 14, wherein the sleep mode is ended in the case where a read operation for the third region is requested.

16. The memory system according to claim 15, wherein, after the sleep mode is ended, the memory controller applies a multitude of times a recovery command for the third region and an address to the resistive memory device such that recovery pulse is applied at least once to the plurality of third resistive memory cells, and then applies a read command for the third region and an address.

17. The memory system according to claim 15, wherein, after the sleep mode is ended, the memory controller applies, in a read operation for the third region, a read with recovery command for the third region and an address.

18. The memory system according to claim 12,
wherein the resistive memory device further includes a fourth region including a plurality of fourth resistive memory cells, and
wherein the memory controller adjusts a level of a read voltage to be applied to a target fourth resistive memory cell among the plurality of fourth resistive memory cells in a read operation for the fourth region.

19. The memory system according to claim 18, wherein the level of the read voltage to be applied to the target fourth resistive memory cell is adjusted according to a time passed after data is written in the fourth region.

* * * * *